United States Patent
Nakano et al.

(10) Patent No.: US 6,709,702 B2
(45) Date of Patent: Mar. 23, 2004

(54) COVER TAPE FOR ELECTRONIC PART CONVEYANCE AND ELECTRONIC PART CONVEYING MEMBER

(75) Inventors: Ichiro Nakano, Osaka (JP); Hiroki Ichikawa, Osaka (JP); Seiji Izutani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/892,859

(22) Filed: Jun. 28, 2001

(65) Prior Publication Data

US 2002/0022131 A1 Feb. 21, 2002

(30) Foreign Application Priority Data

Jun. 28, 2000 (JP) ........................................ 2000-194470

(51) Int. Cl.$^7$ ............................................... B32B 15/08
(52) U.S. Cl. .................. 427/250; 427/124; 428/354; 428/607; 428/623; 428/625; 428/424.8; 428/425.8; 428/461
(58) Field of Search .................... 427/250, 124; 428/354, 607, 623, 625, 424.8, 425.8, 461, 343, 353, 355 N

(56) References Cited

U.S. PATENT DOCUMENTS 4,871,613 A    10/1989    Akao

FOREIGN PATENT DOCUMENTS

| EP | 0 836 936 A1 | 4/1998 |
| JP | A-8-112880 | 5/1996 |
| JP | A-10-86993 | 4/1998 |

OTHER PUBLICATIONS

Encyclopedia of Polymer Science and Engineering; John Wiley & Sons: New York, 1988; vol. 13, pp. 345–368.*
Lee, S. "Coating Methods: Vacuum Coating", Encyclopedia of Polymer Science and Engineering; John Wiley & Sons: New York, 1988, vol. 3, pp. 601–615.*
Patent Abstracts of Japan—08 112880 (May 7, 1996).
Patent Abstracts of Japan—10 086993 (Apr. 7, 1998).
European Search Report dated Nov. 2, 2001.

* cited by examiner

*Primary Examiner*—Nathan M. Nutter
*Assistant Examiner*—Melanie Bissett
(74) *Attorney, Agent, or Firm*—Sughrue Mion, PLLC

(57) ABSTRACT

A cover tape for the electronic-part conveyance comprises at least four laminated layers of: a substrate; at least one layer of a base coating layer and an intermediate layer, provided on the substrate; an adhesive layer, provided on the at least one layer of the coating layer and the intermediate layer; and a conductive layer formed on at least one of the rear surface of the substrate and the front surface of the adhesive layer by deposition.

13 Claims, 1 Drawing Sheet

COVER TAPE FOR ELECTRONIC PART CONVEYANCE AND ELECTRONIC PART CONVEYING MEMBER

BACKGROUND OF THE INVENTION

1. Field of the Invention

The present invention relates to an electronic part conveying member to be used for conveyance of a chip type electronic part, or the like, until it is mounted on a board, and a cover tape to be used for the electronic part conveying member.

2. Description of the Related Art

As a common conveyance embodiment for a chip type electronic part, such as a chip fixing resistor, and a laminated ceramic capacitor, a taping reel method using a tape for conveying an electronic part (electronic part conveying member) is known. According to the taping reel method, an electronic part is inserted into electronic part storage pockets provided by a certain distance in the longitudinal direction of a plastic or paper carrier tape, and the electronic part is sealed by thermally sealing the upper surface with a cover tape so as to be wound up on a reel and conveyed. In a production step of a circuit board, or the like after conveyance, after peeling off the cover tape, an automatic assembly system for automatically suctioning the inserted electronic part by an air nozzle for supplying the same onto a board is mainly used.

In a series of steps from taping to the chip supply to a board, a problem is involved in that the electronic part packaged by taping adheres or melts on the tape adhesive layer surface so as not to be picked up by a suction nozzle at the time of peeling off the cover tape. Moreover, recently, according to the trend toward a light weight, a thin and short shape, a small size, and a high function of the electronic parts such as an IC, there is a high risk of deterioration or destruction of the electronic parts due to the static electricity generated by contact with a carrier tape or a cover tape, or the static electricity generated at the time of peeling off a cover tape. Furthermore, due to variation in the peel strength of a cover tape, an electronic part stored at a predetermined position may come out from a storage pocket, or displacement thereof may occur. Therefore, for such a cover tape for the electronic part conveyance, a countermeasure for the static electricity for reducing the contact electrification voltage and the peeling electrification voltage is called for as well as reduction of the peel strength variation is demanded.

As to the static electricity countermeasure, for only providing a conductivity, a method of applying a conductive coating on the adhesive layer surface of a cover tape, or impregnating a cover tape with a conductive agent can be adopted (see JP-A-10-86993). However, according to the method, the adhesive property of the cover tape is lowered, and thus the function of sealing an electronic part cannot be provided sufficiently. Moreover, as a countermeasure for the static electricity, a method of providing an inorganic substance layer comprising an intermediate layer and a metal foil layer or an inorganic deposition layer between a sealant layer (adhesive layer) and a stretched resin layer (substrate) of a cover tape (see JP-A-8-112880), and a method of including or applying conductive fine particles of a metal oxide, or the like, or a carbon black in an adhesive layer or a substrate have been proposed. However, according to the methods, in providing a sufficient conductivity, a problem is involved in that the transparency (light transmittance) of the cover tape is lowered so that confirmation of a tape by visual recognition or an image process is disturbed, or variation in the peel strength of the tape is enlarged.

SUMMARY OF THE INVENTION

Accordingly, an object of the invention is to provide a cover tape for the electronic part conveyance having both good conductivity and appropriate adhesive property, capable of preventing electrostatic destruction of an electronic part due to the friction electrification by the vibration, or the like during transportation of the electronic part or by the contact with the cover tape adhesive layer surface, peeling electrification at the time of peeling off the cover tape, or the like, capable of reducing the peel strength variation at the time of peeling off, and capable of preventing projection, or the like of the electronic part from an electronic part conveying member.

Another object of the invention is to provide a cover tape for the electronic part conveyance having a high transparency so as to allow preferable visual recognition of an electronic part, in addition to the above-mentioned characteristics.

Still another object of the invention is to provide an electronic part conveying member comprising a cover tape having the above-mentioned excellent performances.

As a result of elaborate discussion of the present inventors for achieving the above-mentioned objects, it was found that by providing a specific layer between a substrate and an adhesive layer as well as forming a conductive layer on at least one selected from the group consisting of the substrate rear surface and the adhesive layer front surface by deposition, troubles of an electronic part derived from the static electricity can be prevented, variation in the peel strength at the time of peeling off can be reduced, and further, the transparency can be retained so as to complete the invention.

That is, the invention provides a cover tape for the electronic part conveyance comprising laminated members in four or more layers, including at least one selected from the group consisting of a base coating layer and an intermediate layer, and an adhesive layer, laminated successively on a substrate as well as a conductive layer formed on at least one selected from the group consisting of the substrate rear surface and the adhesive layer front surface by deposition.

Moreover, the present invention provides an electronic part conveying member comprising an electronic part storage member for storing an electronic part, and a cover tape for covering the electronic part storage member, wherein the above-mentioned cover tape for the electronic part conveyance is used as the cover tape.

Figure 1:
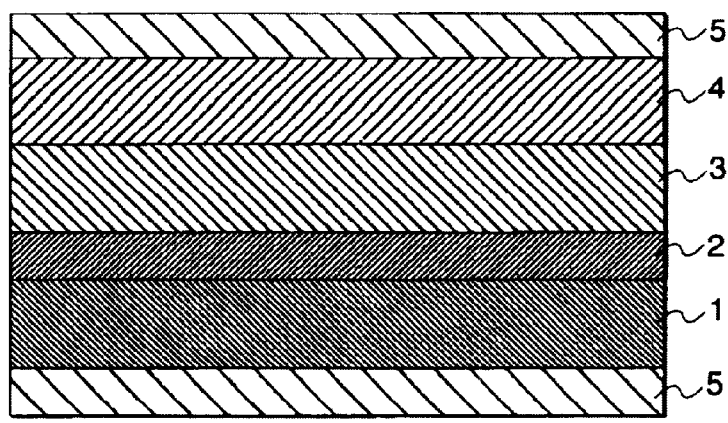
FIG. 1 is a schematic cross-sectional view showing an embodiment of a cover tape for the electronic part conveyance according to the invention.

The reference numerals used in FIG. 1 are set forth below.

1: substrate
2: base coating layer
3: intermediate layer
4: adhesive layer
5: conductive layer (deposition layer)

DETAILED DESCRIPTION OF THE INVENTION

Hereinafter, the invention will be explained in detail with reference to the drawings as needed.

FIG. 1 is a schematic cross-sectional view showing an embodiment of a cover tape for the electronic part conveyance according to the invention. The cover tape for the electronic part conveyance comprises a base coating layer 2, an intermediate layer 3, and an adhesive layer 4 laminated on a substrate 1 in this order as well as a conductive layer 5 is provided on the rear surface of the substrate 1 and the front surface of the adhesive layer 4.

As the substrate 1, those having a self supporting property can be used. Examples thereof include paper; polyolefin based resins such as a polyethylene, and a polypropylene (for example, a high molecular weight polypropylene); polyesters such as a polyethylene terephthalate, a polybutylene terephthalate, and a polyethylene naphthalate; nylons (polyamide); plastic films or sheets of styrene resins such as a polystyrene.

As needed, to the substrate 1, commonly used additives, such as an antioxidant, a ultraviolet ray absorbing agent, a softener, a corrosion preventing agent, an inorganic particle, an antistatic agent (for example, a quaternary ammonium salt based one), a conductive metal powder, an organic conductive high polymer agent, and a titanium based or silane based coupling agent may be added.

It is preferable that the substrate 1 has a melting point of 90° C. or more. In the case the substrate 1 melting point is less than 90° C., the substrate 1 may be contracted or melted at the time of taping an electronic part so that the taping state becomes unstable, and thus there is a risk of drop off or projection of the electronic part.

The substrate 1 may be of either a single layer or a plurality of layers. The substrate 1 thickness is, in general, about 2 to 250 $\mu$m, and preferably about 20 to 200 $\mu$m. A commonly used surface treatment, such as a corona treatment may be applied to the surface of the substrate 1, whereon the base coating layer 2 is to be formed.

The base coating layer 2 is a layer for ensuring the inter-layer strength between the substrate 1 and the intermediate layer 3 (between the substrate 1 and the adhesive layer 4 in the case the intermediate layer is not provided) It can be formed with a known or commonly used adhesive. As a preferable adhesive comprising the base coating layer 2, a urethane adhesive, an organic electrostatic induction preventing adhesive, or the like, can be presented. By providing the base coating layer 2 by the organic electrostatic induction preventing agent, the static electricity preventing effect can further be improved so that, for example, the frictional electrification voltage of the adhesive layer side surface can be reduced dramatically. The base coating layer comprising the organic electrostatic induction preventing adhesive may be formed between the intermediate layer 3 and the adhesive layer 4. For example, it is possible to provide the base coating layer comprising a urethane adhesive, or the like between the substrate 1 and the intermediate layer 3 as well as to provide the base coating layer comprising an organic electrostatic induction preventing adhesive between the intermediate layer 3 and the adhesive layer 4.

As the organic electrostatic induction preventing adhesive, for example, a compound made from a choline chloride, a methyl methacrylate, a 2-methyl imidazol, or the like: product name "BONDEIP" produced by Altec Corp., can be used.

The thickness of the base coating layer 2 is about 0.05 to 30 $\mu$m. In the case the base coating layer 2 is made of a urethane adhesive, or the like, preferably it is about 0.05 to 10 $\mu$m. In the case the base coating layer 2 is made of an organic electrostatic induction preventing agent, if the thickness is too small, the frictional electrification voltage cannot be reduced considerably so that the effect of preventing adhesion of an electronic part on the adhesive layer 5 can hardly be obtained. Therefore, a 0.1 $\mu$m or more thickness is preferable. If the base coating layer 2 thickness is too large, problems can easily arise in that the winding diameter of the tape is increased so as not to be attached on a tape machine, or the like, and thus it is disadvantageous in terms of the cost. The base coating layer 2 can be formed by a commonly used coating method, or the like.

In the case the substrate 1 and the intermediate layer 3 can be laminated with a high adhesive strength, the base coating layer 2 need not always be provided.

The intermediate layer 3 is a layer for improving the close contact property between the substrate 1 and the adhesive layer 4. It is made of, for example, a thermoplastic resin, such as a polyolefin based resin, a thermoplastic elastomer, a rubber, or the like. Among these examples, the polyolefin based resin is particularly preferable. Polymers comprising the intermediate layer 3 can be used alone or in a combination of two or more.

Examples of the polyolefin based resins include polyethylenes (such as a low density polyethylene, a linear low density polyethylene, a metallocene catalyst method polyethylene, a middle density polyethylene, and a high density polyethylene), an ethylene-$\alpha$-olefin copolymer; ethylene copolymers [such as ethylene-unsaturated carboxylic acid copolymers including an ethylene-acrylic acid copolymer (EAA), and an ethylene-methacrylic acid copolymer (EMAA); ionomers (such as a resin with a part of carboxyl groups of the ethylene-unsaturated carboxylic acid copolymer cross-linked with a metal); ethylene-(meth)acrylate copolymers such as an ethylene-methyl acrylate copolymer, an ethylene-ethyl acrylate copolymer (EEA), and an ethylene-methyl methacrylate copolymer; an ethylene-vinyl acetate copolymer (EVA); and an ethylene-vinyl alcohol copolymer].

As needed, a commonly used surface treatment, such as a corona treatment, a plasma treatment, and a burner treatment may be applied to the surface of the intermediate layer 3 for improving the activity. The thickness of the intermediate layer may be selected optionally in a range not to deteriorate the handling property, or the like at the time of providing a cover tape. In general, it is about 5 to 30 $\mu$m.

The intermediate layer 3 can be formed by a commonly used lamination method, such as an extrusion lamination method, a co-extrusion method using a T die tandem extrusion laminator, or the like, and a dry lamination method. In the case the substrate 1 and the adhesive layer 4 can be laminated with a high adhesive strength by the base coating layer 2, the intermediate layer 3 need not always be provided.

As the base polymer comprising the adhesive layer 4, for example, thermoplastic resins such as a polyolefin based resin, a polyester based resin, and a styrene based resin, elastomers such as a thermoplastic elastomer, or the like, can be used. These polymers can be used alone or in a combination of two or more.

Examples of the polyolefin based resins include polyolefins such as a polyethylene (such as a low density polyethylene, a linear low density polyethylene, a metallocene catalyst method polyethylene, a middle density polyethylene, and a high density polyethylene), a polypropylene, an $\alpha$-olefin copolymer (such as an ethylene-propylene copolymer, an ethylene-butene-1 copolymer, and a propylene-butene-1 copolymer); and ethylene copolymers [such as ethylene-unsaturated carboxylic acid copolymers including an ethylene-acrylic acid copolymer (EAA), and an ethylene-methacrylic acid copolymer (EMAA); ionomers; ethylene-(meth)acrylate copolymers such as an ethylene-methyl acrylate copolymer, an ethylene-ethyl acrylate copolymer (EEA), and an ethylene-methyl methacrylate copolymer; an ethylene-vinyl acetate copolymer (EVA); and an ethylene-vinyl alcohol copolymer].

Examples of the thermoplastic elastomers include styrene based thermoplastic elastomers (styrene based block copolymers; such as a styrene based block copolymer with a 5% by weight or more styrene content) such as an SIS (styrene-isoprene-styrene block copolymer), an SBS (styrene-butadiene-styrene block copolymer), an SEBS (styrene-ethylene-butylene-styrene block copolymer: a hydrogenated product of an SBSS), an SEPS (styrene-ethylene-propylene-styrene block copolymer: a hydrogenated product of an SIS), and an SEP (styrene-ethylene-propylene block copolymer); polyurethane thermoplastic elastomers; polyester based thermoplastic elastomers; blended thermoplastic elastomers provided, for example, by the polymer blending of a polypropylene and an EPT (a ternary ethylene-propylene rubber); a hydrogenated polyisopylene based polymer, and a hydrogenated polyisobutylene based polymer.

To the adhesive layer 4, in general, a tackifier resin is added. As the tackifier resin, for example, a petroleum resin [such as an aliphatic petroleum resin (C5 based), an aromatic petroleum resin (C9 based), and an alicyclic petroleum resin with the aromatic petroleum resin hydrogenated], a rosin based resin, an alkyl phenol resin, and a styrene based resin can be presented. These tackifier resins can be used alone or in a combination of two or more. By containing the tackifier resin in the adhesive layer 4, the taping operativity is improved as well as a stable and good adhesive force can be obtained in a packaging base material such as a carrier tape.

It is preferable that the softening temperature of the tackifier resin is 50° C. or more. With a less than 50° C. softening temperature, the adhesive layer can easily be softened during the transportation or storage so that an electronic part adheres or melts on the adhesive layer 4, and thus problems can easily be generated at the time of assembly in a circuit board, or the like.

The amount of the tackifier resin is about 2 to 100 parts by weight, preferably about 5 to 50 parts by weight with respect to 100 parts by weight of the base polymer. In the case the tackifier resin amount is less than 2 parts by weight, due to the low adhesive force, the tape may be lifted after taping so that there is a risk of projection of the part. Moreover, in the case the tackifier resin amount is more than 100 parts by weight, due to the high adhesive force, the electronic part can adhere and melt on the adhesive layer 4 so that it is difficult to suck the electronic part with an air nozzle at the time of assembly in a circuit board, or the like.

The adhesive layer 4 may further contain additives such as a phosphorous based or phenol based antioxidant, an ultraviolet ray absorbing agent, a corrosion preventing agent, a softener, a surfactant, an electrification preventing agent, a filler, a coupling agent, and a cross-linking agent. The amount of each additive is, in general, about 0 to 10 parts by weight (for example, 0.01 to 10 parts by weight) with respect to 100 parts by weight of the base polymer. With a more than 10 parts by weight additive amount, the adhesive property can easily be lowered.

The thickness of the adhesive layer 4 can be selected optionally in a range not to deteriorate the adhesive property or the handling property. In general, it is about 2 to 90 μm. With a less than 2 μm adhesive layer 4 thickness, the adhesive force is weak. With a more than 90 μm thickness, taping failure can easily be generated due to increase of the total tape thickness and sticking out of the glue at the time of taping.

The adhesive layer 4 can be formed by a commonly used lamination method, such as an extrusion lamination method, a co-extrusion method using a T die tandem extrusion laminator, or the like, and a dry lamination method.

The conductive layer 5 is formed by deposition. The conductive layer 5 can be formed on both of the substrate 1 rear surface and the adhesive layer 4 front surface as in the embodiment shown in FIG. 1, but it can be formed only on either of the substrate 1 rear surface or the adhesive layer 4 front surface.

As the material provided for the deposition, any one can be used as long as it can be deposited. Examples thereof include metals such as Al, Cu, Ag, Ni, Ti, Fe, Cr, Zr, Ta, and Zn, an alloy containing at least one of the above-mentioned metals including the SUS, and an inorganic oxide. Among these examples, a metal or an alloy containing the metal are preferable.

The thickness of the conductive layer 5 provided by the deposition can be selected optionally without the range not to deteriorate the transparency, the adhesive property, or the like. In general, it is about $1 \times 10^{-4}$ to 0.02 μm With a less than $1 \times 10^{-4}$ m thickness, the static electricity preventing effect is lowered. With a more than 0.02 μm thickness, although the static electricity preventing effect is high, the transparency is deteriorated or the adhesive property with respect to the carrier tape is lowered, and thus it is not preferable. The deposition can be carried out by a commonly used method with a vacuum deposition device.

According to a cover tape for the electronic part conveyance of the invention, it is preferable that the surface resistivity of both surfaces is in a range from $10^2$ Ω/□ (Ω/square) to $10^{13}$ Ω/□, in particular, in a range from $10^4$ Ω/□ to $5 \times 10^{12}$ Ω/□. The surface resistivity can be adjusted optionally by selecting the kind of the material comprising the conductive layer 5, the thickness of the conductive layer 5, or the like.

It is preferable that the frictional electrification voltage of the adhesive layer side surface is 3,000 V or less, in particular, 1,000 V or less, particularly preferably 30 V or less. The frictional electrification voltage can be adjusted by optionally selecting the kind of the material comprising the conductive layer 5, the conductive layer 5 thickness, the thickness of the base coating layer comprising the electrification induction preventing agent, or the like.

Furthermore, according to a cover tape for the electronic part conveyance of the invention, it is preferable that the light transmittance is 60% or more, in particular, 70% or more. The light transmittance of the tape can be adjusted by optionally selecting the material comprising each of the substrate, the base coating layer, the intermediate layer, the adhesive layer and the conductive layer, and the thickness of each layer. In particular, since the conductive layer is formed by the deposition in the invention so that the conductivity can be provided by an extremely thin film thickness, a high transparency can be sustained.

An electronic part conveying member according to the invention comprises an electronic part storage member for storing an electronic part, and a cover tape for covering the electronic part storage member, wherein the cover tape for the electronic part conveyance is used as the cover tape.

As a representative example of such an electronic part conveying member, a conveying member comprising an emboss carrier tape with an electronic part storage recess member for storing an electronic part formed in a substantially center part in the width direction by a predetermined interval in the longitudinal direction, and a cover tape for the electronic part conveyance for covering the upper surface of the electronic part storage recess member can be presented.

As the material for the emboss carrier tape, those having a self supporting property can be used. Examples thereof include paper such as Japanese paper, crepe paper, synthetic paper, mixed paper, and composite paper; plastic films or sheets of a polyethylene, a polypropylene, a polyethylene terephthalate, a polyvinyl chloride, and cellophane; and a metal foil.

Moreover, as another example of an electronic part conveying member according to the invention, for example, a conveying member comprising a square hole punch carrier tape with a square punch hole formed for inserting a part, a bottom cover tape for covering the lower surface of the square hole of the square hole punch carrier tape, and a top cover tape for covering the upper surface of the square hole of the square hole punch carrier tape, can be presented.

According to the conveying member, a cover tape for the electronic part conveyance of the invention can be used, for example, as the top cover tape.

A cover tape for the electronic part conveyance and an electronic part conveying member according to the invention can preferably be used widely for the conveyance of chip type electronic parts such as resistors including a chip fixing resistor, and capacitors including a laminated ceramic capacitor.

According to the invention, since a specific layer is provided between the substrate and the adhesive layer of the cover tape as well as the conductive layer is provided by deposition on at least either of the substrate rear surface and the adhesive layer front surface, problems derived from the static electricity, such as the friction electrification due to vibration during the transportation of an electronic part, or the like, electrostatic destruction of an electronic part due to the contact with the cover tape adhesive layer surface, or peeling electrification at the time of peeling off the cover tape can be prevented. Moreover, since the conductive layer can be provided as an extremely thin film layer, a high transparency can be sustained, and thus the excellent visual recognition property of an electronic part can be provided. Furthermore, since the conductive layer can be provided on the substrate rear surface as well as formation of a thin film can be enabled even in the case of providing the conductive layer on the adhesive layer front surface, the adhesive property of the adhesive layer cannot be deteriorated so that variation in the peel strength at the time of peeling off can be reduced. Therefore, various step troubles can be prevented in a series of steps from the conveyance to the assembly in a circuit board, and thus the reliability of the part and the reliability in mounting can be improved dramatically.

Hereinafter, the invention will be explained in further detail with reference to examples, but the present invention is not limited to these examples.

EXAMPLE 1

100 parts by weight of an ethylene/vinyl acetate (EVA) resin (produced by Mitsubishi Plastics, Inc., product name: "LV360"), 15 parts by weight of an alicyclic saturated hydrocarbon based resin (produced by Yasuhara Chemical Co., Ltd., product name: "Clearon P115"), 0.5 part by weight of an antioxidant (produced by Chiba Special Chemicals Corp., product name: "IRG#1010"), and 1.0 part by weight of a nonionic surfactant (produced by NOF Corporation., product name: "Nonion HS-210") were melted and mixed by a two-axes kneader. After co-extrusion with a polyethylene (PE), it was bonded with a polyester film via a urethane adhesive by a dry lamination method so as to produce a tape (total thickness 50 $\mu$m) having a layer configuration with the adhesive layer (EVA; thickness 15 $\mu$m)/intermediate layer (PE; thickness 10 $\mu$m)/base coating layer (urethane adhesive; thickness 0.5 $\mu$m)/substrate (polyester; thickness 25 $\mu$m). Deposition was applied on the substrate front surface and the adhesive layer front surface of the tape, using a metal SUS for forming conductive layers each of a 0.007 $\mu$m thickness and a 0.005 $\mu$m thickness so as to obtain a cover tape.

EXAMPLE 2

A resin composition obtained by melting and mixing 80 parts by weight of a middle density polyethylene (middle density PE; produced by Mitsui Chemicals, Inc., product name: "NEO-ZEX 40150C"), 20 parts by weight (polymer total 100 parts by weight) of a potassium ionomer (produced by Mitsui Dupont Polychemical Corp., product name: "SD100"), 20 parts by weight of a petroleum based resin (product name: "Alkon P-90"), and 0.5 part by weight of a phenol antioxidant (produced by Ciba-Geigy, product name: "Irganox 1010") by a two-axes kneader, and a blended product of 100 parts by weight of a polyethylene (PE) and a high molecular weight polypropylene (high molecular weight PP) and 10 parts by weight of an electrification preventing agent (quaternary ammonium salt, and the like) added thereto were processed by the three layer co-extrusion so as to produce a tape (total thickness 55 $\mu$m) having a layer configuration with the adhesive layer (middle density PE+potassium ionomer; thickness 15 $\mu$m)/intermediate layer (PE; thickness 15 $\mu$m)/substrate (high molecular amount PP; thickness 25 $\mu$m). Deposition was applied on the substrate front surface of the tape, using a metal Al for forming a conductive layer of a 0.004 $\mu$m thickness so as to obtain a cover tape.

Comparative Example 1

70 parts by weight of a styrene-butadiene-styrene block copolymer (SBS; styrene content 20% by weight) and 30 parts by weight of an ethylene-$\alpha$-olefin copolymer resin were dry blended. With 30 parts by weight of a tin oxide as a conductive agent added thereto, it was kneaded and pelletized. The obtained pellets and a PE resin were processed by the two layer co-extrusion by an inflation extruder so as to form a film. A corona treatment was applied to the surface of the PE layer of the obtained film. A polyethylene terephthalate (PET) film was laminated by a dry lamination method, using a urethane adhesive. An aging treatment was applied at 50° C. for 24 hours so as to produce a tape (total thickness 46 $\mu$m) having a layer configuration with the conductive agent containing adhesive layer (SBS+ethylene-$\alpha$-olefin copolymer resin+conductive agent; thickness 15 $\mu$m)/intermediate layer (PE; thickness 15 $\mu$m)/base coating layer (urethane adhesive; thickness 0.5 $\mu$m)/substrate (PET; thickness 16 $\mu$m).

Comparative Example 2

75 parts by weight of an ethylene/vinyl acetate (EVA) resin (vinyl acetate content 15% by weight) and 25 parts by weight of an ethylene-$\alpha$-olefin copolymer resin were dry blended. With 0.5 parts by weight of a quaternary ammonium salt as an electrification preventing agent added thereto, it was kneaded and pelletized. The obtained pellets and a PE resin were processed by the two layer co-extrusion by a T dice extruder so as to form a film. A corona treatment was applied to the surf ace of the PE layer of the obtained film. An electrification preventing polyethylene terephthalate (PET) film was laminated by a dry lamination method, using a urethane adhesive. An aging treatment was applied at 50° C. for 24 hours so as to produce a tape (total thickness 50 $\mu$m) having a layer configuration with the electrification preventing agent containing adhesive layer (EVA+ethylene-$\alpha$-olefin copolymer resin+electrification preventing agent; thickness 15 $\mu$m)/intermediate layer (PE; thickness 10 $\mu$m)/ base coating layer (urethane adhesive; thickness 0.5 $\mu$m)/ substrate (electrification preventing PET; thickness 25 $\mu$m).

Evaluation Test

The following tests were executed for each of the tapes obtained in the examples and the comparative examples. Results are shown in the table 1.

(Total Thickness)

The tape total thickness ($\mu$m) was measured with ¹⁄₁,₀₀₀ mm dial gauge.

(Tensile Strength and Ductility)

It was measured by a 300 mm/minute elastic stress rate condition by a Tensilon.

(Adhesive Force With Respect to Embosses)

The adhesive layer surface of the tape was superimposed on the surface of a polystyrene sheet with embosses formed.

After pressing by a heat sealer for 0.5 second by a 140° C. and pressure 2.5 kgf/cm² (250 kPA) condition, a peeling force was measured at a peeling rate 300 mm/minute, peeling angle about 180° condition in an ordinary temperature (average value of three times). Moreover, the difference of the maximum value and the minimum value of the measurement values of the tests executed three times (adhesive force min-max) was calculated.
(Surface Resistivity)

The surface resistivity of the adhesive layer side surface and the substrate side surface was measured by a minute current electrometer.
(Half Life Value)

Based on the JIS L 1094, the half life was measured by a static honest meter. The half life value denotes the time needed for the voltage generated by electrification of the tape substrate side surface, reaching to the value half as much as the initial voltage.
(Frictional Electrification Voltage)

Based on the JIS L 1094, the electrification voltage was measured after rubbing the tape adhesive layer side surface with cloth. Moreover, with a 20° C., 25% RH condition, the frictional electrification voltage was measured as a frictional electrification voltage under a low humidity.
(Part Adhesion Property (=Adhesion to Part))

With the tape adhesive layer and chips (50 pieces) contacted, after heating at 50° C. for 10 minutes, the chip adherence ratio was found.
(Light Transmittance)

The light transmittance of the tape was measured by a haze meter.

TABLE 1

|  | Example 1 | Example 2 | Comparative Example 3 | Comparative Example 2 |
|---|---|---|---|---|
| Total thickness (μm) | 50 | 55 | 46 | 50 |
| Tensile strength (N/5.25 mm) | 25 | 15 | 23 | 25 |
| Ductility (%) | 120 | 270 | 120 | 124 |
| Adhesive force with respect to embosses (N/2 mm) | 0.20 | 0.30 | 0.40 | 0.15 |
| Adhesive force min–max (N/2 mm) | 0.03 | 0.06 | 0.18 | 0.10 |
| Surface resistivity (Ω/□): |  |  |  |  |
| Adhesive-layer-side surface | $1.5 \times 10^7$ | $2.7 \times 10^{11}$ | $2.0 \times 10^{10}$ | $3.6 \times 10^{11}$ |
| Substrate-side surface | $5.0 \times 10^6$ | $1.5 \times 10^8$ | — | $2.0 \times 10^{10}$ |
| Half life value (sec) | 0 | 0 | 15 | 30 |
| Frictional electrification voltage (V) | 5 | 4.5 | 35 | 105 |
| Frictional electrification voltage under low humidity (V) | 5 | 16 | 260 | 235 |
| Part adhesion property (%) | 0 | 0 | 15 | 5 |
| Light transmittance (%) | 87 | 75 | 35 | 80 |

The entire disclosure of each and every foreign patent application from which the benefit of foreign priority has been claimed in the present application is incorporated herein by reference, as if fully set forth herein.

We claim:

1. A method for producing a cover tape for the electronic-pan conveyance, said cover tape comprising:
    a substrate;
    at least one layer of a base coating layer and an intermediate layer, provided on die substrate;
    an adhesive layer, provided on said at least one layer of the base coating layer and the intermediate layer; and
    a conductive layer formed on at least one of the rear surface of the substrata and the front surface of the adhesive layer, wherein the conductive layer has a thickness of from $1 \times 10^{-4}$ to 0.007 μm,
    said method comprising forming said conductive layer on at least one of the rear surface of the substrate and the front surface of the adhesive layer by deposition.

2. The method for producing a cover tape for the electronic-part conveyance according to claim 1, wherein the conductive layer comprises at least one of Al, Cu, Ag, Ni, Ti, Fe, Cr, Zr, Ta, Zn, and an alloy containing at least one of Al, Cu, Ag, Ni, Ti, Fe, Cr, Zr, Ta and Zn.

3. The method for producing a cover tape for the electronic-part conveyance according to claim 1, wherein the adhesive layer comprises 100 parts by weight of a base polymer and 2 to 100 parts by weight of a tackifier resin, and the adhesive layer has a thickness of 2 to 90 μm.

4. The method for producing a cover tape for the electronic-pail conveyance according to claim 1, wherein the base coating layer comprises at least one of a urethane adhesive and an electrostatic induction preventing adhesive.

5. The method for producing a cover tape for the electronic-part conveyance according to claim 1, wherein the intermediate layer comprises a polyolefin based resin.

6. The method for producing a cover tape for the electronic-part conveyance according to claim 1, wherein both surfaces of the cover tape have a surface resistivity of $10^2$ to $10^{13}$ Ω/□.

7. The method for producing a cover tape for the electronic-part conveyance according to claim 1, wherein the cover tape has a light transmittance of 60% or more.

8. The method for producing a cover tape for the electronic-part conveyance according to claim 1, wherein the cover tape has a frictional electrification voltage of 3,000 V or less at the adhesive layer side surface.

9. The method for producing a cover tape for the electronic-part conveyance according to claim 1, wherein the substrate has a melting point of 90° C. or more.

10. A method for producing an electric-part-conveying member, said electric-part-conveying member comprising:
    an electronic-part-storage member for storing an electronic part; and
    a cover tape covering the electronic-part-storage member,
    wherein the cover tape comprises at least four laminated layers of:
    a substrate;
    at least one layer of a base coating layer and an intermediate layer, provided on the substrate;
    an adhesive layer, provided on said at least one layer of the base coating layer and the intermediate layer; and
    a conductive layer formed on at least one of the rear surface of the substrate and the front surface of the adhesive layer by deposition, wherein the conductive layer has a thickness of from $1 \times 10^{-4}$ to 0.007 μm,
    said method comprising forming said conductive layer on at least one side of the rear surface of the substrate and the front surface of the adhesive layer by deposition.

11. The method for producing a cover tape for the electronic-part conveyance according to claim 1, wherein the deposition is by vacuum deposition.

12. A cover tape for the electronic-part conveyance made by the method of claim 1.

13. An electric-part-conveying member made by the method of claim 10.

* * * * *